(12) United States Patent
Susak et al.

(10) Patent No.: US 6,507,175 B2
(45) Date of Patent: Jan. 14, 2003

(54) SYSTEM AND METHOD FOR DETECTION OF ZERO CURRENT CONDITION

(75) Inventors: David Susak, Phoenix, AZ (US); Ryan Goodfellow, Mesa, AZ (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 09/978,125

(22) Filed: Oct. 15, 2001

(65) Prior Publication Data

US 2002/0089314 A1 Jul. 11, 2002

Related U.S. Application Data

(60) Provisional application No. 60/240,340, filed on Oct. 13, 2000.

(51) Int. Cl.[7] .............................. G05F 1/00; G05F 3/16
(52) U.S. Cl. ........................................ 323/235; 323/315
(58) Field of Search ................................ 323/235, 266, 323/271, 282, 285, 290, 312, 315, 316

(56) References Cited

U.S. PATENT DOCUMENTS

| | | | |
|---|---|---|---|
| 4,945,441 A | | 7/1990 | Kaneko |
| 5,333,105 A | | 7/1994 | Fortune |
| 5,351,012 A | | 9/1994 | Toumazou |
| 5,508,602 A | * | 4/1996 | Borgato et al. ............ 323/222 |
| 5,619,137 A | | 4/1997 | Vig et al. |
| 5,757,166 A | * | 5/1998 | Sodhi ........................ 323/222 |
| 6,043,633 A | * | 3/2000 | Lev et al. ................... 323/222 |
| 6,144,245 A | * | 11/2000 | Balogh ....................... 327/380 |

FOREIGN PATENT DOCUMENTS

DE        198 38 657 A1     3/2000

* cited by examiner

*Primary Examiner*—Matthew Nguyen
(74) *Attorney, Agent, or Firm*—Snell & Wilmer

(57) ABSTRACT

The present invention is directed to a circuit that is configured to detect a zero current condition at a certain point. The circuit includes a current mirror coupled to two transistors, where the first transistor is coupled to ground and the second transistor is coupled to the point being sensed. The outputs of both the first transistor and the second transistor are each coupled to an input of a comparator. The comparator is configured to determine when an equal voltage condition is present at the two inputs, which signifies a zero-current condition. Such a zero current detector can be used in a buck regulator to prevent a current flow from load to ground and attendant inefficiencies that result. An alternative embodiment involves the use of a controller to sense three different voltages to determine the state of the switches.

12 Claims, 10 Drawing Sheets

SYSTEM AND METHOD FOR DETECTION OF ZERO CURRENT CONDITION

CROSS-REFERENCE TO RELATED APPLICATIONS

This application claims priority from provisional patent application Ser. No. 60/240,340, filed Oct. 13, 2000.

BACKGROUND OF THE INVENTION

1) Field of the Invention

This application relates generally to electronic circuits and more particularly to an electronic circuit for detecting a zero current condition, where such a circuit can be used in voltage regulators and switching power converters ("SPC"), including multiphase power converters.

2) Background

Power regulators are often used in electronic equipment to supply power at a predetermined voltage to a system. For example, a typical desktop computer may contain a power supply that converts alternating current ("AC") from a wall socket, to direct current ("DC") with a voltage that is usable by the various components of the computer system. With continued reference to computer systems, a hard disk drive may require a 12 volt ("V") power input, while various integrated circuit components may require, for example, power at 5.0 V, 3.3 V, or 1.5 V. A power supply must thus contain power regulators to generate the required voltage levels.

Buck power regulators are often used to generate power outputs for microelectronic devices because they are relatively efficient and provide high current stewing (di/dt) capability. When providing a microprocessor with a regulated input voltage, di/dt and response time are very important considerations. The output inductor value of the regulator determines the di/dt capability of the regulator and also the boundary between continuous conduction mode ("CCM") (when the inductor current is continuous) and discontinuous conduction mode ("DCM") (when the inductor current is not continuous, but drops to zero until the transistor is turned ON; DCM typically occurs when a low load resistance is coupled to the buck power regulator).

With reference to FIG. 1, an exemplary buck (step-down) power regulator 100, which converts a DC voltage to a lower voltage, is presented. A supply voltage, $V_s$, is input into transistor 102, which is coupled to a diode 104 that, in turn, is coupled to ground. Coupled to the junction of transistor 102 and diode 104 is an LC circuit comprising an inductor 106 and a capacitor 108. A load 110 thus receives power at the required voltage, where the voltage is determined by the duty cycle of transistor 102 (i.e., the percentage of time when transistor 102 is turned on).

When transistor 102 is on, inductor 106 is being charged and the supply voltage supplies the output current. When transistor 102 is turned off, inductor 106 "freewheels" through diode 104 and supplies the energy to load 110. The purpose of the diode is not to rectify, but to re-direct current flow in the circuit and to ensure that there is a path for the current from the inductor to flow. Capacitor 108 serves to reduce the ripple content in the voltage, while inductor 106 smoothes the current passing through it.

A problem of the buck power regulator is that, as low voltage outputs are required, the voltage drop of diode 104 leads to various consequences. For example, the circuit becomes less efficient because of the voltage drop of approximately 0.7 volt across the diode. Such inefficiencies become less tolerable when devices run on battery power as opposed to AC power.

In response to the above deficiencies, buck power regulator 200, detailed in FIG. 2, was developed. As can be seen, buck power regulator 200 is similar to buck power regulator 100, with a transistor 204 replacing diode 104. Transistor 204 may be configured to have a low on resistance. Transistor 102 is usually termed the high-side switch and transistor 204 is the low-side switch. In addition drivers 222 and 224 control the operation of transistors 102 and 104, respectively. By controlling the on and off cycles of transistors 102 and 204, drivers 222 and 224 are able to more efficiently control the output voltage, $V_{out}$, that is present at load 110, and supply the desired amount of current.

In normal operation of a power converter, there is a ripple in the output current, due to the charging and discharging of inductor 106. One method of reducing the ripple of the output current is the use of a multiphase power supply. Instead of having, for example, a single source supplying a 20 amp output, there may be four phases, each of which supply 5 amps. An exemplary multiphase buck power converter is shown in FIG. 12.

In multiphase power converter 1200, it is desired to convert an input voltage 1202 to an output voltage 1204 across a load 1206. In a manner similar to that described above with respect to FIG. 2, transistors 1212 and 1214 are each coupled to the input voltage 1202. Coupled to the junction 1211 of transistors 1212 and 1214 is inductor 1216. Similarly, transistors 1222 and 1224 are each coupled to the input voltage 1202. Coupled to the junction 1221 of transistors 1222 and 1224 is inductor 1226. Similarly, transistors 1232 and 1234 are each coupled to the input voltage 1202. Coupled to the junction 1231 of transistors 1232 and 1234 is inductor 1236. Similarly, transistors 1242 and 1244 are each coupled to the input voltage 1202. Coupled to the junction 1241 of transistors 1242 and 1244 is inductor 1246. Each of the transistor pairs is coupled to capacitor 1208 to provide the output needed at output 1204. Because of the presence of four power converters, each converter is only responsible for one-fourth of the total current needed, resulting in smaller transistors and inductors and a corresponding reduction in cost. In addition, the ripple in the output current is reduced because each of the converters is only responsible for a portion of the output current. The phases are slightly offset from each other such that the peak current of each individual phase do not coincide with each other. This is shown in FIG. 15, which shows the individual output currents for each phase as well as the total output current. As can be readily seen, the ripple in the output current is substantially reduced from the ripple in the current of each individual phase, and the period of the ripple is approximately one-fourth of the ripple of each individual phase.

FIG. 3 presents a plot of the inductor current of an exemplary buck power regulator. Axis 302 represents the passage of time, while axis 304 details the current flowing through inductor 106. The current flowing through inductor 106 rises for the time period $T_{on}$ when transistor 102 is on and the current falls during time period $T_{off}$ when transistor 102 is off. The period, T, is $T_{on}$ plus $T_{off}$. The output voltage would be the input voltage times $T_{on}$.

Problems may arise, however, when buck power regulator 200 is required to produce a voltage through a smaller load. An exemplary resulting current plot is shown in FIG. 4. It can be seen that the current through inductor 106 becomes negative during a portion of the cycle, i.e., the current through inductor 106 reverses direction and flows into the ground. This behavior is undesirable because of the various inefficiencies that occur because the inductor is basically wasting power that would ideally remain in the system. Such a problem may not be present in buck power regulator 100 of FIG. 1, as diode 104 automatically "turns off" when the polarity of the inductor current changes.

It is desirable to develop a method and apparatus for converting voltage that alleviate the above and other problems that may be present in the prior art.

SUMMARY OF THE INVENTION

The present invention uses a Zero Current Detection ("ZCD") circuit to determine the direction of current flow in various circuits, such as a switch of a switching power converter ("SPC"). In such a manner, once zero current is detected, the operation of the circuit can be changed such that inefficiencies are reduced.

In one embodiment, the ZCD circuit may comprise a pair of current mirrors supplying current to a matched pair of transistors. One of the transistors is coupled to ground while the other transistor is coupled to the node of interest. The outputs of the matched pair are input into a comparator. When the non-inverting input voltage exceeds the inverting input voltage, the comparator changes state.

In one embodiment, the ZCD circuit may be used in a SPC that is configured as a buck converter having Field Effect Transistors ("FETs") used as power switches. The ZCD signal may be used to maximize the efficiency of the system by controlling the operation of the FETs during DCM operation. In such a manner, the current flow through the inductor is prevented from becoming negative.

In another embodiment, the ZCD circuit may be used in a multiphase power converter in a tri-state mode to decrease the switching time when transients occur.

The result is increased system efficiency and faster transient response.

BRIEF DESCRIPTION OF THE DRAWING FIGURES

A more complete understanding of the present invention may be derived by referring to the detailed description and claims when considered in connection with the Figures, where like reference numbers refer to similar elements throughout the Figures, and:

Figure 7:
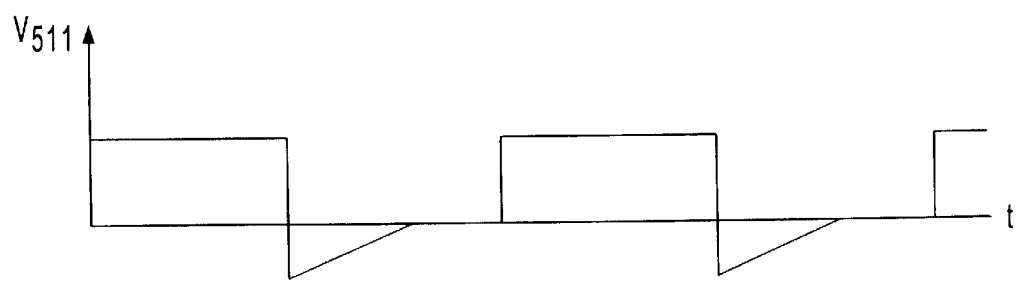
Figure 5:
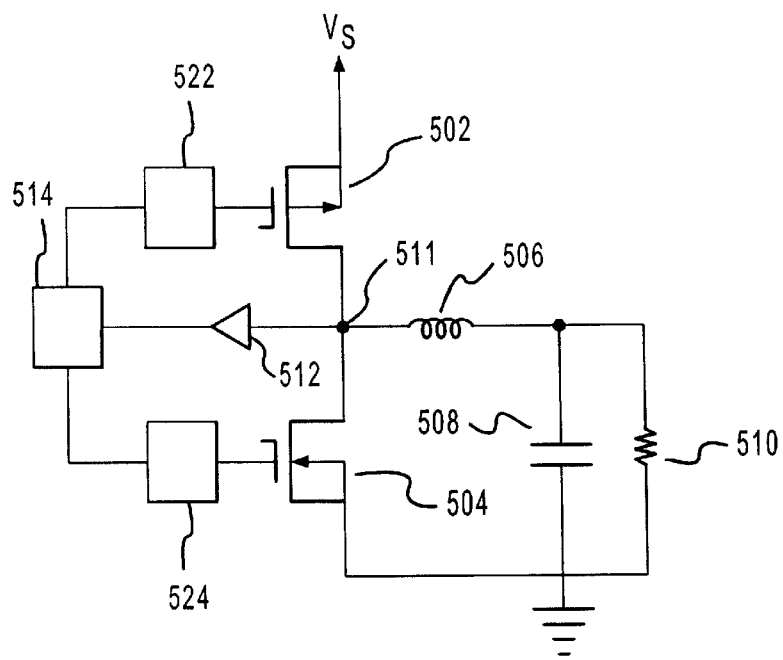
Figure 6:
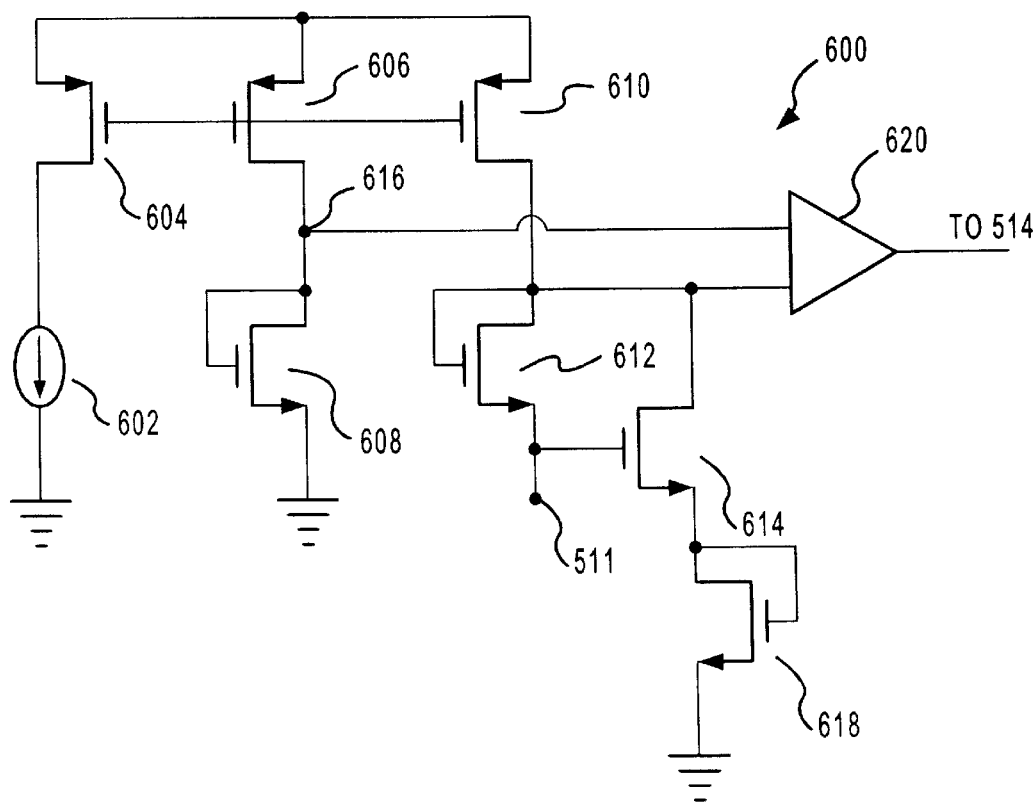
Figure 8:
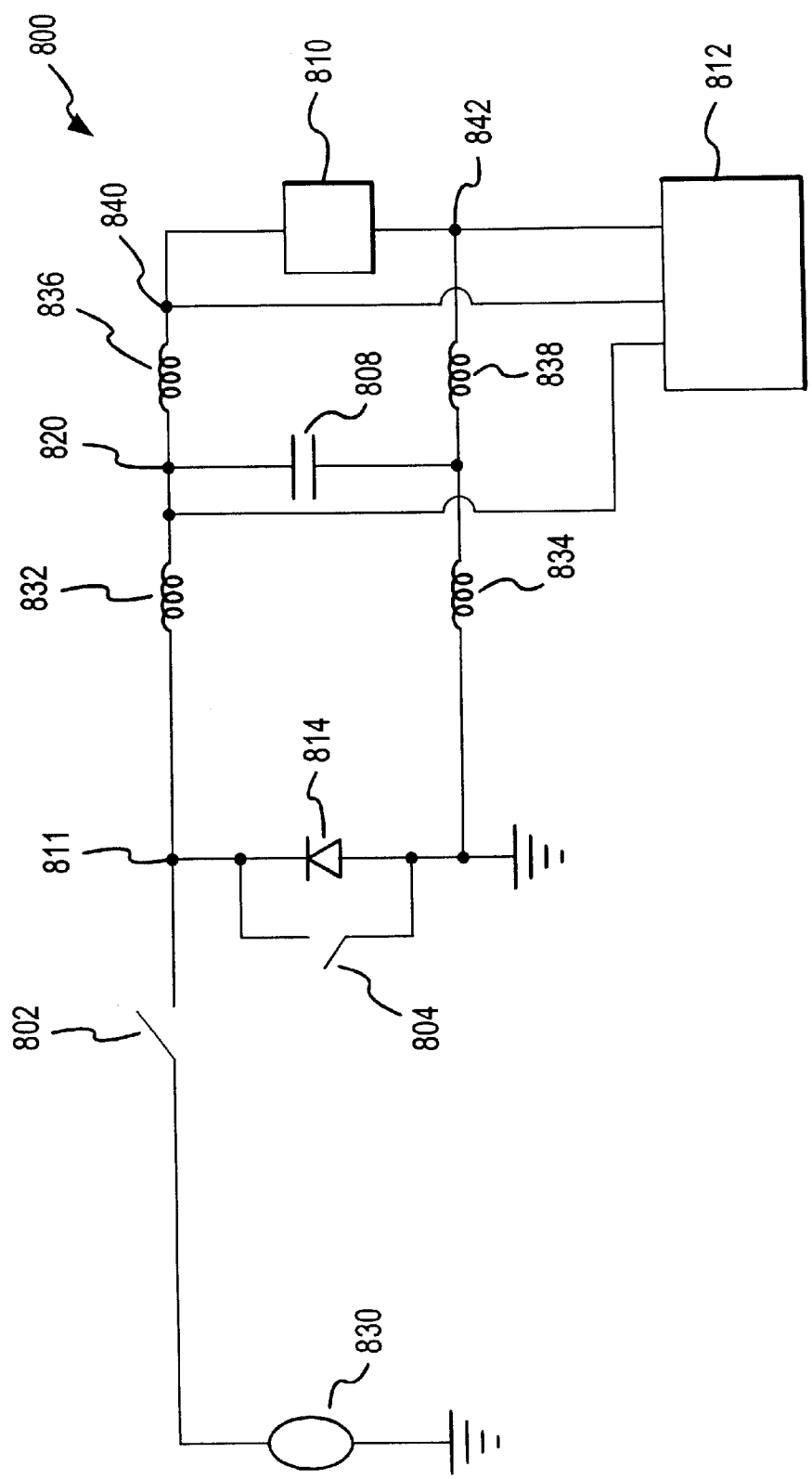
Figure 9:
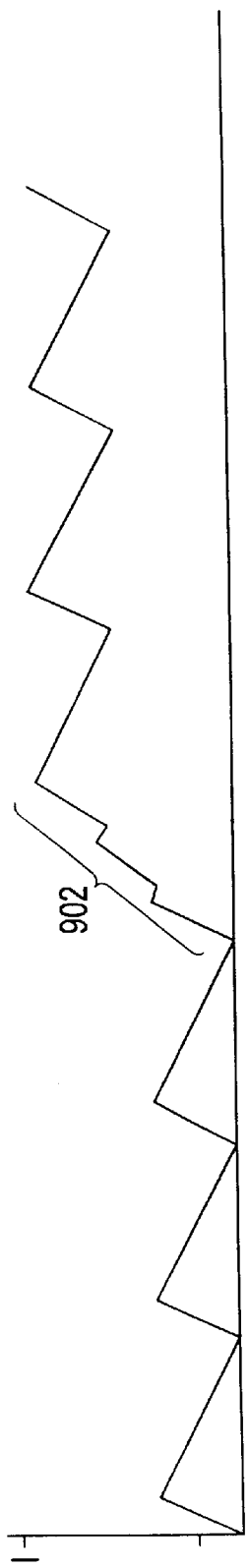
Figure 10:
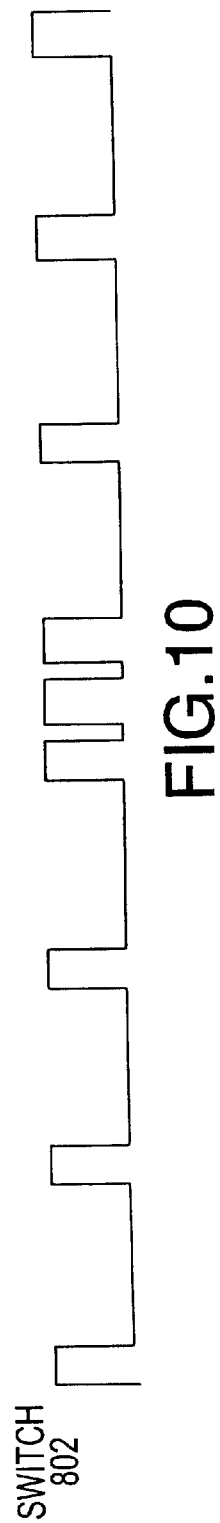
Figure 11:
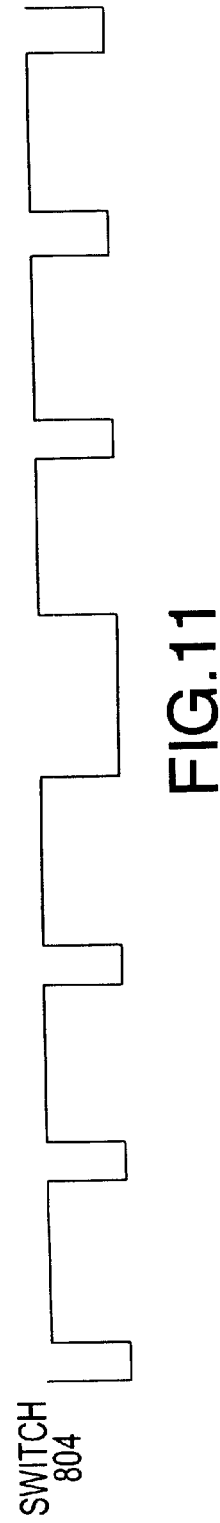
Figure 12:
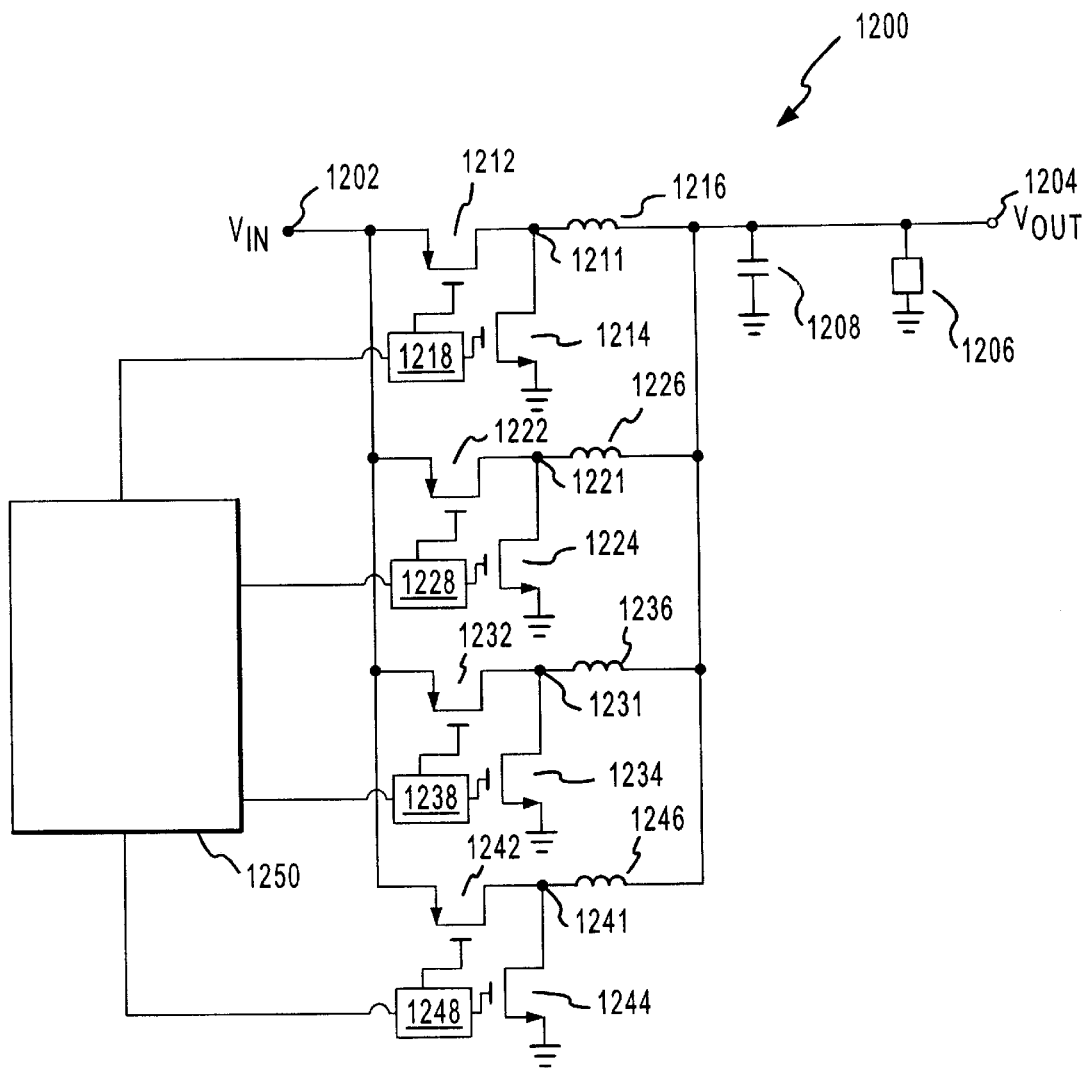
Figure 13:
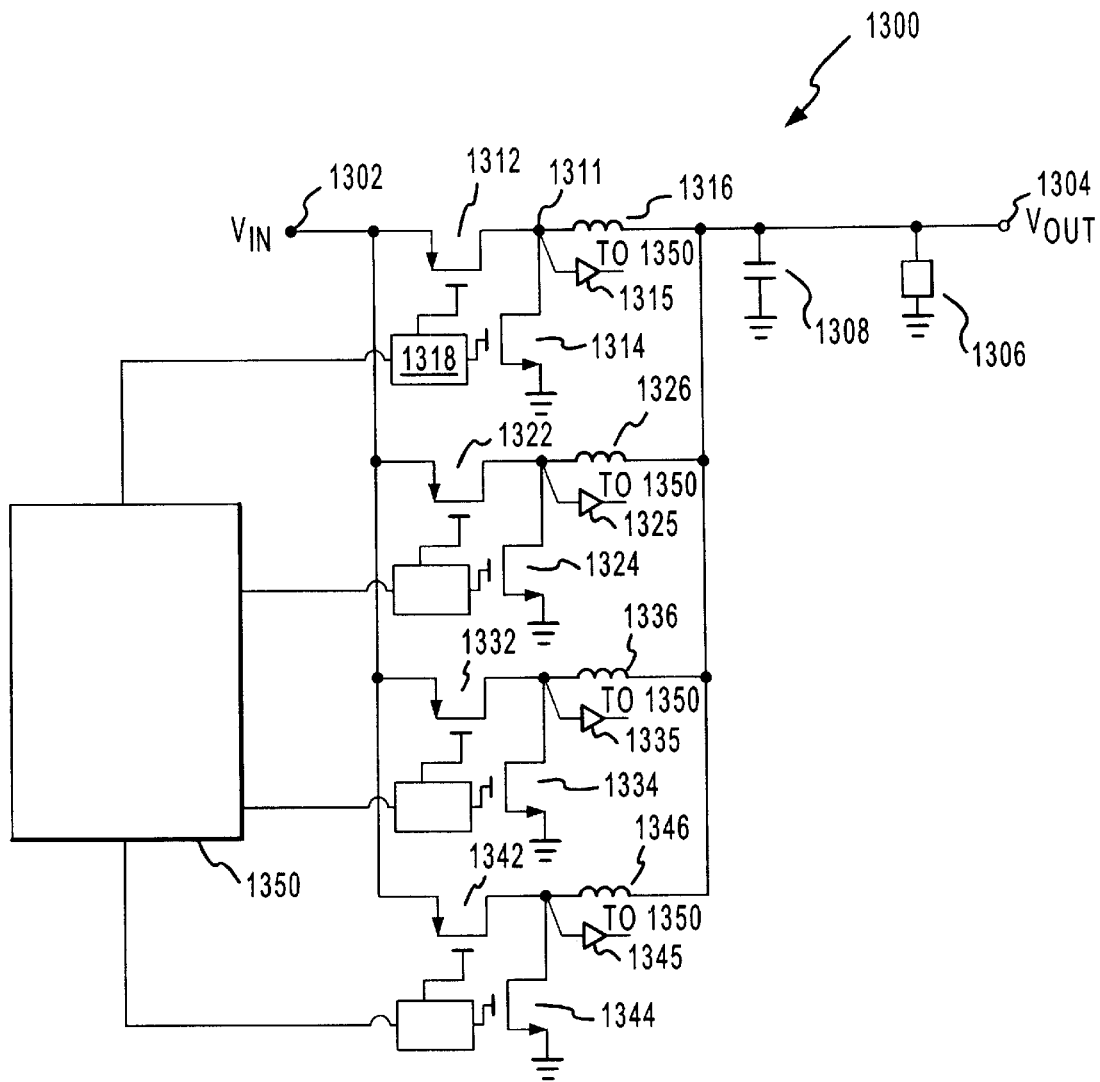
Figure 14:
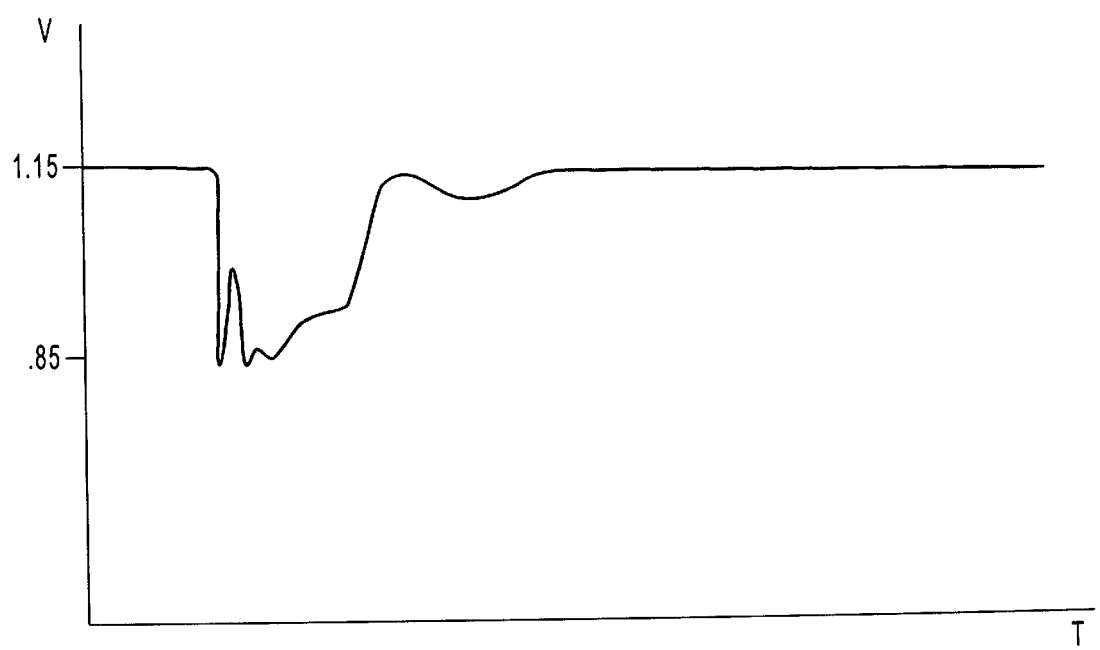
Figure 15:
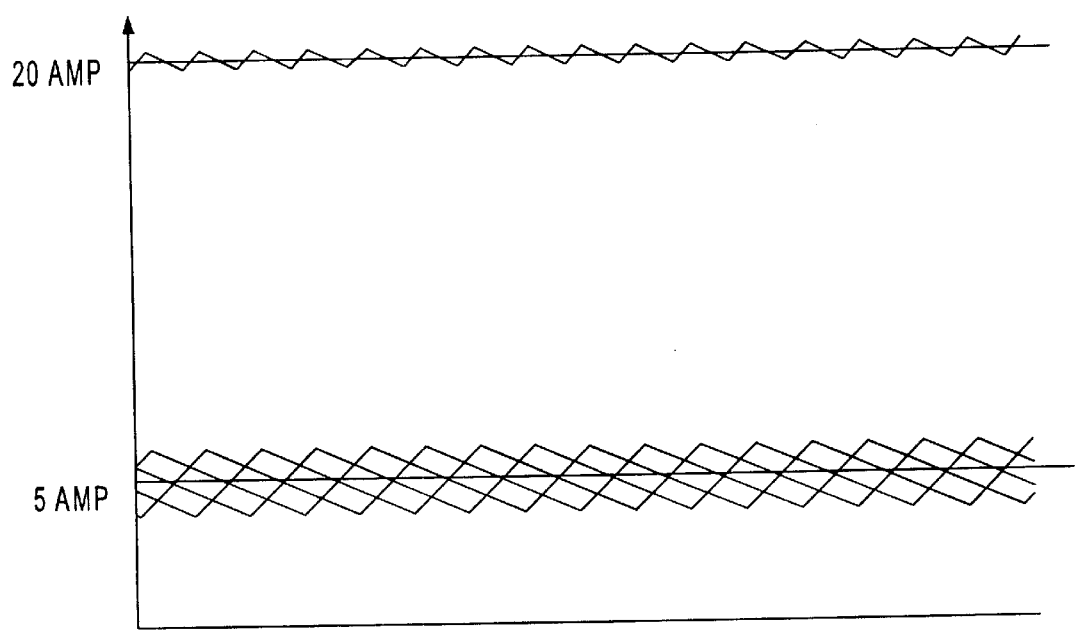
Figure 16:
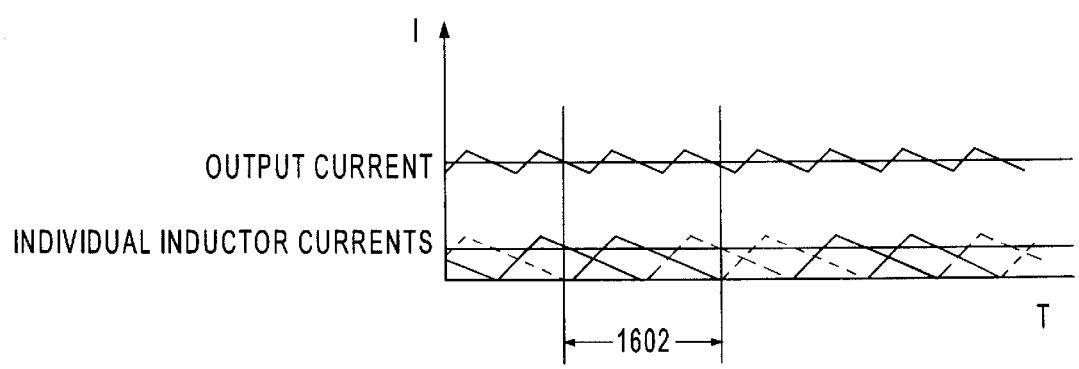

FIG. 5 presents a further improvement to a buck power regulator;

FIG. 6 illustrates an exemplary embodiment of the zero current detector;

FIG. 7 shows a voltage/time curve of an embodiment of the present invention;

FIG. 8 shows an alternative embodiment of a buck power regulator using the zero current detector;

FIG. 9 shows the output current when a transient occurs;

FIGS. 10 and 11 shows the operation of the switches in a buck power regulator;

FIG. 12 illustrates an exemplary multiphase buck power converter;

FIG. 13 illustrates an exemplary multiphase buck power converter with a zero current detector;

FIG. 14 shows the output voltage present during a load transient;

FIG. 15 shows the output current when using a multiphase power converter; and FIG. 16 shows the output current when using a multiphase power converter using a zero current detector.

DETAILED DESCRIPTION OF EXEMPLARY EMBODIMENTS

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes, inductors, and the like, whose values may be suitably configured for various intended purposes. In addition, the present invention may be practiced in any integrated circuit application where a detection of a zero current flow is desired. Such general applications that may be appreciated by those skilled in the art in light of the present disclosure are not described in detail herein. Further, it should be noted that while various components may be suitably coupled or connected to other components within exemplary circuits, such connections and couplings can be realized by direct connection between components, or by connection through other components and devices located therebetween.

FIG. 5 presents an exemplary embodiment of a buck power regulator. A transistor 502 is coupled to a transistor 504 at node 511. Coupled to the junction 511 of transistors 502 and 504 are inductor 506, capacitor 508, and load 510. A driver 522 is coupled to transistor 502 and a driver 524 is coupled to transistor 504. Drivers 522 and 524 serve to control when transistors 502 and 504, respectively, are conducting and when they are off. In addition, there is also a zero current detector 512 coupled to junction 511. The output of zero current detector 512 is coupled to a controller 514, which is coupled to both drivers 522 and 524 to control the conduction of transistors 502 and 504. The output of the regulator is at node 520.

Figure 4:
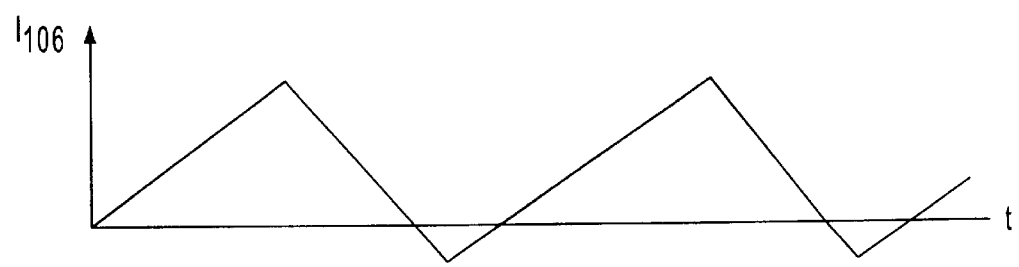
FIG. 4 shows the inductor current of an exemplary buck power regulator supplying a low voltage.

With reference to FIG. 4 and FIG. 5, it can be seen that the current through inductor 506 is identical to the current at junction 511. When the current at junction 511 reaches a level of zero amps, current detector 512 outputs a signal to controller 514, which then sends a signal to driver 524, which turns transistor 504 off. With transistor 504 turned off, current no longer flows from inductor 506 into ground. The energy in the inductor also becomes zero and capacitor 508 cannot discharge into ground because switch 504 is closed, resulting in a more efficient power regulation than a buck power regulator with a diode.

With reference to FIG. 6, an exemplary zero current detection circuit 600 is disclosed. A current source 602 supplies current to transistor 604. Transistors 606 and 610 act as a current mirror and supply substantially identical current to transistors 608 and 612, each of which may be configured in diode-connected fashion, as illustrated in FIG. 6. In a preferred embodiment, transistors 606 and 610 are matched to within a tight tolerance of each other. Transistors 608 and 612 are also matched with to within a tight tolerance of each other. The source of transistor 608 is coupled to ground, while the source of transistor 612 is coupled to junction 511 (see FIG. 5). Both transistors 608 and 612 are coupled to inputs of comparator 620. Comparator 620 is coupled to controller 514. Comparator 620 is configured such that, when both inputs to comparator 620 are equal, the output of comparator 620 changes, as detailed in FIG. 8. Comparator 620 is preferably a low-offset, high-speed comparator.

Both transistor 608 and transistor 612 are coupled to the same amount of current, via current mirrors 606 and 610, respectively. Because the source of transistor 608 is coupled to ground and the source of transistor 612 is coupled to junction 511, transistors 608 and 612 produce an equal voltage at their respective drains when the input to the source of transistor 608 is equal to the input of the source of transistor 612. In other words, when junction 511 is equal to ground (i.e., the voltage is zero), the voltages at the drains of transistors 608 and 612 are equal. Thus, transistors 608 and 612 serve to level shift the inputs into the common-mode range of comparator 620. It can be readily shown that the voltage at junction 511 is zero only when there is no current flowing through junction 511. Transistors 614 and 618 serve to prevent an excessive voltage level at comparator 620 by directing excessive voltage to ground.

The voltage at junction 511 is ideally shown in FIG. 7. It can be seen that the voltage at junction 511 is at a peak when transistor 502 first turns on and inductor 506 is being charged by the power supply. The voltage at junction 511 drops below zero voltage when transistor 502 turns off, as inductor 506 pulls charge from ground through transistor 504, resulting in a negative voltage potential at junction 511. The voltage reaches zero when the current through inductor 506 begins to flow in the opposite direction, from inductor 506, through transistor 504, to ground. Thus, it can be seen that, by sensing the voltage at junction 511, the zero current detect circuit is able to determine when the current is zero by detecting when the voltage at junction 511 is zero.

Thus, the zero current detection circuit 600 disclosed in FIG. 6 can be used in place of element 512 of FIG. 5 to detect when the current through inductor 506 begins to flow in the negative direction. Once it is determined that a zero current condition is present, driver 524 can be configured to turn off transistor 504 to prevent voltage from flowing from inductor 506 to ground. This results in increased efficiency as the amount of energy lost to ground is drastically reduced.

An alternative embodiment of the power regulator is presented in FIG. 8. Power regulator 800 features a voltage source 830 that feeds a switch 802. It should be understood that switches 802 and 804 may suitably be replaced with a transistor switch and diode 814 is shown parallel to switch 804 to demonstrate an FET switch. A load inductance 832 and a capacitor 808 and a load 810 is also present in the circuit. Also illustrated in FIG. 8 are parasitic inductances 836, 834, and 838. The output of the circuit can be taken at node 820.

Voltage is sensed at both sides of load 810. The measurement taken at the high side of the line, at nor 840, is termed $V_{sense}+$. The measurement taken on the low side, from node 842, is termed $V_{sense}-$. The two voltage measurements are input to controller 812, which operates switches 802 and 804. The two voltage measurements serve to provide a more accurate reading, to controller 812, of when a change in the load is encountered. It should be understood that a zero detect circuit, although not illustrated, may also be present in power regulator 800. Such a zero detect circuit may be coupled to node 811 to sense a zero current condition. The presence of the zero current condition can be forwarded to controller 812 to more accurately control switches 802 and 804.

The operation of the circuit may be described more fully with respect to FIGS. 9–11. FIG. 9 illustrates a graph of the current through load 810 in exemplary operation. As can be seen at the left end of the graph, when load 810 presents a low load (high impedance), the current through load 810 is also low. However, when the impedance is decreased, current through load 810 rises to a high value, as can be seen at the right end of FIG. 9. The time period during the transient from the steady-state operation at low load and the steady-state operation at high load is depicted as region 902 and may be termed the hysteretic mode.

During the steady-state modes, the operation of switches 802 and 804 are periodic, as depicted in FIG. 10 for switch 802 and FIG. 11 for switch 804. During those periods, switch 802 and 804 may operate in a mutually exclusive manner, as shown in FIGS. 10 and 11. In other words, when switch 802 is on, switch 804 is off and when switch 802 is off, switch 804 is on. The ratio between the on time and off time of the switches determines the output voltage of the regulator. However, during the hysteretic mode, switch 802 may pulse on and off to set the current through load 810 to the appropriate level. Once the appropriate current level is established, operation of the switches continues as before.

The result is that, in a relatively small amount of time, circuit 800 is able to react to a change in the load and supply the correct amount of current to the load.

Figure 1:
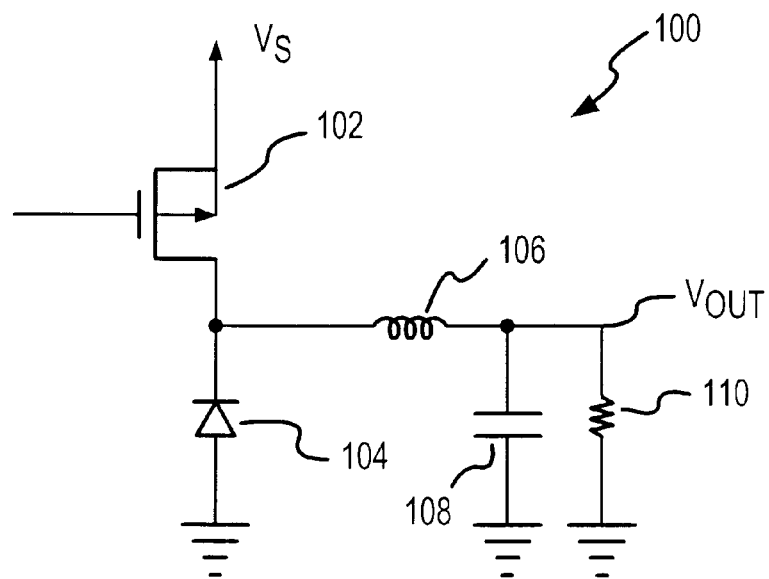
FIG. 1 illustrates an exemplary buck power regulator of the prior art.
Figure 2:
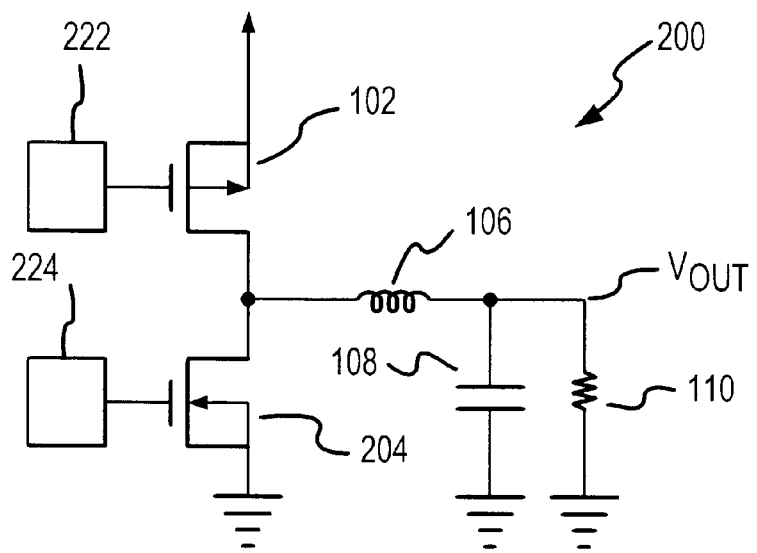
FIG. 2 illustrates an improved buck power regulator.
Figure 3:
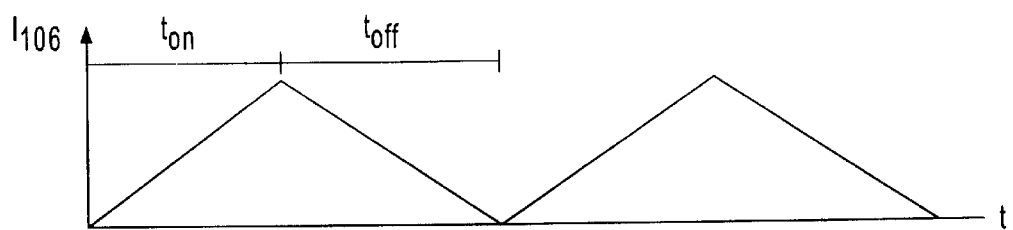
FIG. 3 shows the inductor current of an exemplary buck power regulator supplying a high voltage.

In a multiphase power converter, with reference to FIG. 13, the configuration of the circuit is as follows. In multiphase power converter 1300, it is desired to convert an input voltage 1302 to an output voltage 1304 across a load 1306. In a manner similar to that described above with respect to FIG. 2, transistors 1312 and 1314 are each coupled to the input voltage 1302. Coupled to the junction 1311 of transistors 1312 and 1314 is inductor 1316 and zero current detector 1315. Similarly, transistors 1322 and 1324 are each coupled to the input voltage 1302. Coupled to the junction 1321 of transistors 1322 and 1324 is inductor 1326 and zero current detector, 1325. Similarly, transistors 1332 and 1334 are each coupled to the input voltage 1302. Coupled to the junction 1331 of transistors 1332 and 1334 is inductor 1336 and zero current detector 1335. Similarly, transistors 1342 and 1344 are each coupled to the input voltage 1302. Coupled to the junction 1341 of transistors 1342 and 1344 is inductor 1346 and zero current detector 1345. Each of the transistor pairs is coupled to capacitor 1308 to provide the output needed at output 1304.

The use of the zero current detector has a profound effect on the operation of the power converter. It is understood that, when the load to a power converter increases, there is a corresponding increase in the current. Typically, when such an increase in the current occurs, there is a corresponding decrease in the voltage at the load. With reference to FIG. 14, the load voltage/time curve of an exemplary power converter of the prior art is shown. The voltage begins at a level of approximately 1.15 volts. When a load transient occurs and more current is being drawn from the power converter, the voltage at the load decreases to approximately 0.85 volts and remains lower than required for a certain time period, while the power converter is adapting to the change in current. Once the power converter has adapted, the output voltage is back at the specified 1.15 volts. Modern electronics require a very steady supply voltage in order to operate correctly. A prolonged droop in the voltage can be very detrimental to the operation of certain electronic components.

As described above, the typical configuration of switches in a power converter switches the high side switch and the low side switch simultaneously, such that only one of the switches is on at one time. During transients, however, there may be an occasion when both switches are off at one time, with the high side switch pulsing, in order to supply more current to the load. In addition, as described above, when a zero current condition is detected, both switches may be off, to prevent current from flowing into ground. Thus, it can be seen that, in order to supply more current to the load, the low-side transistor (transistors 1314, 1324, 1334, and 1344) is turned off.

One reason for the voltage droop is because, if the low-side switch is on, it must be turned off before the current to the load can be increased. However, with the combination of the zero current detection circuit and the multiphase power converter, it can be seen that there is a greater likelihood of the low-side switches being off, resulting in a faster transient response. With reference to FIG. 16, the operation of the multiphase power converter with the zero current detector will be graphically described.

FIG. 16 shows the current/time graph of the 4-phase, multiphase power converter, along with the individual inductor currents. During region 1602 of the graph, one of the individual phases is at zero current, forcing both the low and high side switches off. As described above, when the current through an individual inductor is rising, the high-side switch is on and the low-side switch is off. When the current through an individual inductor is falling, the high-side switch is off and the low-side switch is on. It can be seen that, during region 1602, of the four different phases, only one or two of the other phases simultaneously have falling inductor current. Therefore, only one or two low-side switches are on at once. Thus, during a load transient, there is a lesser necessity to turn off low-side switches to meet the higher current requirements. This results in a faster response to transients due to increased load.

It should also be understood that such an improved transient response time is also present in the embodiment shown in FIG. 5, for the same reason.

The above description presents exemplary modes contemplated in carrying out the invention. The techniques described above are, however, susceptible to modifications and alternate constructions from the embodiments shown above. Other variations and modifications of the present invention will be apparent to those of ordinary skill in the art, and it is the intent of the appended claims that such variations and modifications be covered. For example, the present invention may be used in a multiphase power converter with multiple low-side switches. The multiple low-side switches may be switched off (e.g., using a tri-state mode of operation) to decrease the response time of the converter. While the zero current detection circuit was described with respect to a buck power regulator, it can be used in various other applications. For example, the zero current detection circuit can be used in a highly-phased power regulation system such as those used in low-voltage conversion applications such as for microprocessor loads. The ZCD may be used as part of a power IC to detect when a switching element is at ground. When zero current is detected, the operation of the power regulation system may be changed to minimize various inefficiencies that may be present due to high RMS currents.

Consequently, it is not the intention to limit the invention to the particular embodiments disclosed. On the contrary, the invention is intended to cover all modifications and alternate constructions falling within the scope of the invention, as expressed in the following claims when read in light of the description and drawings. No element described in this specification is necessary for the practice of the invention unless expressly described herein as "essential" or "required."

We claim:

1. A system for detecting zero current comprising:
   a current source;
   a current mirror with an input, a first output and a second output, where the input is coupled to said current source;
   a first transistor coupled to said first output of said current mirror;
   a second transistor coupled to said second output of said current mirror; and
   a comparator coupled to said first transistor and said second transistor; wherein,
   said first transistor is coupled to a first voltage level;
   said second transistor is coupled to a second voltage level; and
   wherein said comparator is configured to provide a predetermined output indicating zero current when the inputs from said first transistor and said second transistor are equal.

2. The system of claim 1 further comprising:
   a third transistor coupled between said second transistor and said comparator, wherein said transistor is configured to prevent an overload input into said comparator.

3. The system of claim 2 further comprising:
   a fourth transistor coupled to said third transistor, said fourth transistor being coupled to ground.

4. The system of claim 1 wherein said first voltage level is a ground voltage.

5. A system for comparing inputs comprising:
   a power supply;
   a current mirror with an input, a first output and a second output, where the input is coupled to said power supply;
   a first transistor coupled to said first output of said current mirror;
   a second transistor coupled to said second output of said current mirror; and
   a comparator coupled to said first transistor and said second transistor; wherein,
   said first transistor is coupled to a first voltage level;
   said second transistor is coupled to a second volt age level; and
   wherein said comparator is configured to provide a predetermined output when the inputs from said first transistor and said second transistor are equal.

6. An apparatus for converting power comprising:
   a first transistor;
   a second transistor coupled to ground and to said first transistor, forming a junction between said first transistor and said second transistor;
   an inductor coupled to said junction between said first transistor and said second transistor;
   a zero current detection circuit coupled to said junction between said first transistor and said second transistor; and
   a logic circuit coupled to said zero current detection circuit, said first transistor, and said second transistor, and wherein:
   said first transistor and said second transistor are each separately controlled via said logic circuit.

7. The apparatus of claim 3 wherein said logic circuit contains 3 modes of operation:

the first mode of operation comprising said first transistor being turned on and said second transistor being turned off;

the second mode of operation comprising said first transistor being turned off and said second transistor being turned on; and the third mode of operation comprising both said first transistor and said second transistor being turned off.

8. The apparatus of claim 7 wherein the duration of said first mode of operation is proportional to a desired output voltage of said apparatus.

9. The apparatus of claim 7 wherein the duration of said second mode of operation is proportional to a desired output voltage of said apparatus.

10. The apparatus of claim 7 wherein said third mode of operation is controlled based on the operation of said zero current detection circuit.

11. An apparatus for converting power comprising:

a first transistor;

a second transistor coupled to ground and to said first transistor, forming a junction between said first transistor and said second transistor;

an inductor coupled to said junction between said first transistor and said second transistor; and a zero current detection circuit coupled to said junction between said first transistor and said second transistor, said zero current detection circuit comprising:

a current source;

a current mirror with an input and a first output and a second output, where the input is coupled to the current source;

a first transistor coupled to said first output of said current mirror;

a second transistor coupled to said second output of said current mirror; and a comparator coupled to said first transistor and said second transistor; wherein, said first transistor is coupled to ground;

said second transistor is coupled to said junction between said first transistor and said second transistor; and wherein said comparator is configured to provide a predetermined output when the inputs from said first transistor and said second transistor are equal.

12. An apparatus for converting power comprising:

a first transistor;

a second transistor coupled to ground and to said first transistor, forming a first junction between said first transistor and said second transistor;

a first inductor coupled to said first junction between said first transistor and said second transistor;

a first zero current detection circuit coupled to said first junction between said first transistor and said second transistor;

a third transistor;

a fourth transistor coupled to ground and to said third transistor, forming a second junction between said third transistor and said fourth transistor;

a second inductor coupled to said second junction between said first transistor and said second transistor;

a second zero current detection circuit coupled to said second junction between said third transistor and said fourth transistor;

a fifth transistor;

a sixth transistor coupled to ground and to said fifth transistor, forming a third junction between said fifth transistor and said sixth transistor;

a third inductor coupled to said junction between said fifth transistor and said sixth transistor;

a third zero current detection circuit coupled to said third junction between said fifth transistor and said sixth transistor;

a seventh transistor;

a eighth transistor coupled to ground and to said seventh transistor, forming a fourth junction between said seventh transistor and said eighth transistor;

a fourth inductor coupled to said fourth junction between said seventh transistor and said eighth transistor; and a fourth zero current detection circuit coupled to said fourth junction between said seventh transistor and said eighth transistor.

* * * * *